United States Patent
Hashii et al.

(10) Patent No.: US 12,406,863 B2
(45) Date of Patent: Sep. 2, 2025

(54) WAFER SEPARATION APPARATUS AND METHOD, AND METHOD FOR MANUFACTURING SILICON WAFER

(71) Applicant: SUMCO CORPORATION, Tokyo (JP)

(72) Inventors: Tomohiro Hashii, Tokyo (JP); Tsukasa Yoshihara, Tokyo (JP); Yasunori Yoshioka, Tokyo (JP); Kawahito Shinichi, Tokyo (JP); Sumihisa Masuda, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 116 days.

(21) Appl. No.: 18/390,435

(22) Filed: Dec. 20, 2023

(65) Prior Publication Data

US 2024/0213050 A1 Jun. 27, 2024

(30) Foreign Application Priority Data

Dec. 23, 2022 (JP) .................... 2022-207614

(51) Int. Cl.
*B32B 43/00* (2006.01)
*H01L 21/67* (2006.01)
*H01L 21/02* (2006.01)

(52) U.S. Cl.
CPC ...... *H01L 21/67092* (2013.01); *B32B 43/006* (2013.01); *B32B 2457/14* (2013.01); *H01L 21/02043* (2013.01); *Y10T 156/1174* (2015.01); *Y10T 156/1939* (2015.01); *Y10T 156/195* (2015.01)

(58) Field of Classification Search
CPC ............ B32B 43/006; Y10T 156/1137; Y10T 156/1174; Y10T 156/1939; Y10T 156/195
See application file for complete search history.

(56) References Cited

U.S. PATENT DOCUMENTS

| | | | |
|---|---|---|---|
| 6,500,298 B1 * | 12/2002 | Wright | B29C 63/0013 156/708 |
| 2007/0261783 A1 * | 11/2007 | Larson | H01L 21/67132 156/247 |
| 2013/0206331 A1 * | 8/2013 | Ho | B26F 3/004 156/247 |
| 2016/0332436 A1 * | 11/2016 | Tang | B32B 38/10 |
| 2019/0160801 A1 * | 5/2019 | Wang | B32B 38/10 |

FOREIGN PATENT DOCUMENTS

| | | |
|---|---|---|
| JP | 9-237817 | 9/1997 |
| JP | 2015-233059 | 12/2015 |

* cited by examiner

*Primary Examiner* — Philip C Tucker
*Assistant Examiner* — Nickolas R Harm
(74) *Attorney, Agent, or Firm* — Greenblum & Bernstein, P.L.C.

(57) ABSTRACT

It would be helpful to provide a wafer separation apparatus and method, and a method for manufacturing a silicon wafer in which poor wafer separation can be easily prevented. A wafer separation apparatus 1 includes an injection port 2 configured to inject a fluid, a rolling element 3, and a holder 4 configured to movably hold the rolling element 3 in a rollable and integral manner, to be reciprocatable and biased to one side in a reciprocating direction, and to be integrally connected to the injection port 2.

6 Claims, 4 Drawing Sheets

WAFER SEPARATION APPARATUS AND METHOD, AND METHOD FOR MANUFACTURING SILICON WAFER

TECHNICAL FIELD

The present disclosure relates to a wafer separation apparatus and method, and a method for manufacturing a silicon wafer.

BACKGROUND

Semiconductor wafers (for example, silicon wafers) are commercialized by slicing a semiconductor ingot into a plurality of wafers through a slicing process and then polishing and otherwise processing each wafer.

To the plurality of wafers obtained by slicing the semiconductor ingot, sludge derived from a grinding fluid or the like used in the slicing process adheres. Therefore, after the slicing process, the wafers are sent one by one to a cleaning process for cleaning. The wafers are then contained in batches in cassettes and transported for a polishing process. Here, in order to sequentially separate a wafer from a wafer stack consisting of the plurality of wafers stacked one another and send the wafer to the cleaning process, a wafer separation apparatus and method in which a fluid is injected to flow into between an outermost wafer and the other wafers are known. For example, see Patent Literatures (PTLs) 1 and 2.

CITATION LIST

Patent Literature

PTL 1: JP 2015-233059 A
PTL 2: JP H09-237817 A

SUMMARY

In a wafer stack, an outermost wafer may be tilted due to sludge being caught between wafers. The occurrence of the tilt may cause a change in the relative position between a fluid injection port and a target position into which an injected fluid should flow, and hence hinder the fluid from flowing into the target position, which may result in poor separation of the outermost wafer. Such poor wafer separation causes a stop of a cleaning process and reduces production efficiency, and therefore is desirably prevented as much as possible.

It would be helpful to provide a wafer separation apparatus and method, and a method for manufacturing a silicon wafer in which poor wafer separation can be easily prevented.

An aspect of the present disclosure is as follows.

[1]
A wafer separation apparatus including:
an injection port configured to inject a fluid;
a rolling element; and
a holder configured to movably hold the rolling element in a rollable and integral manner, to be reciprocatable and biased to one side in a reciprocating direction, and to be integrally connected to the injection port.

[2]
The wafer separation apparatus according to [1], wherein the holder is configured to be reciprocatable by rotational operation.

[3]
The wafer separation apparatus according to [1] or [2], wherein the rolling element is configured of a roller.

[4]
A wafer separation method using the wafer separation apparatus according to any one of [1] to [3], the wafer separation method including:
moving the injection port according to the position of an end surface of an outermost wafer included in a wafer stack in a stacking direction, by bringing the rolling element into contact with the end surface of the outermost wafer;
separating the outermost wafer by injecting a fluid from the injection port moved by the moving of the injection port so that the fluid flows into between the outermost wafer and another wafer; and
conveying the outermost wafer separated by the separating of the outermost wafer in a conveyance direction that intersects with the stacking direction.

[5]
The wafer separation method according to [4], wherein in the moving of the injection port, the rolling element is brought into contact with a portion of the end surface of the outermost wafer on the side of the injection port.

[6]
A method for manufacturing a silicon wafer, the method including using the wafer separation method according to [4] or [5],
wherein the wafer is a silicon wafer.

According to the present disclosure, it is possible to provide a wafer separation apparatus and method, and a method for manufacturing a silicon wafer in which poor wafer separation can be easily prevented.

DETAILED DESCRIPTION

An embodiment of the present disclosure will be exemplarily described below with reference to the drawings.

Figure 1:
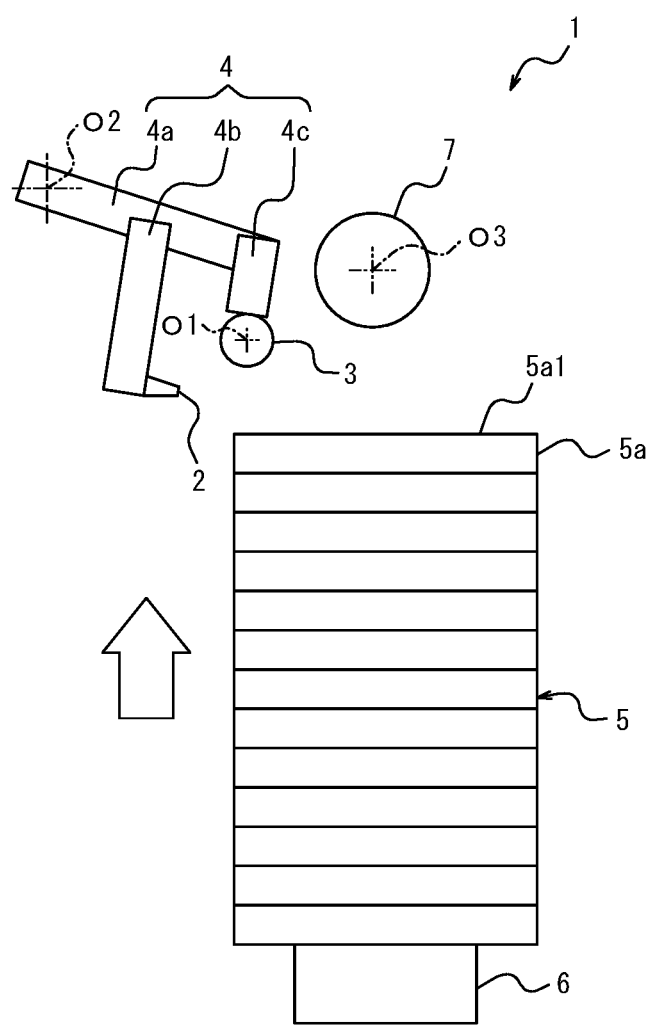
FIG. 1 is a schematic diagram illustrating a state in which a wafer stack is being fed to one side in a stacking direction in a wafer separation apparatus according to an embodiment of the present disclosure.
Figure 2:
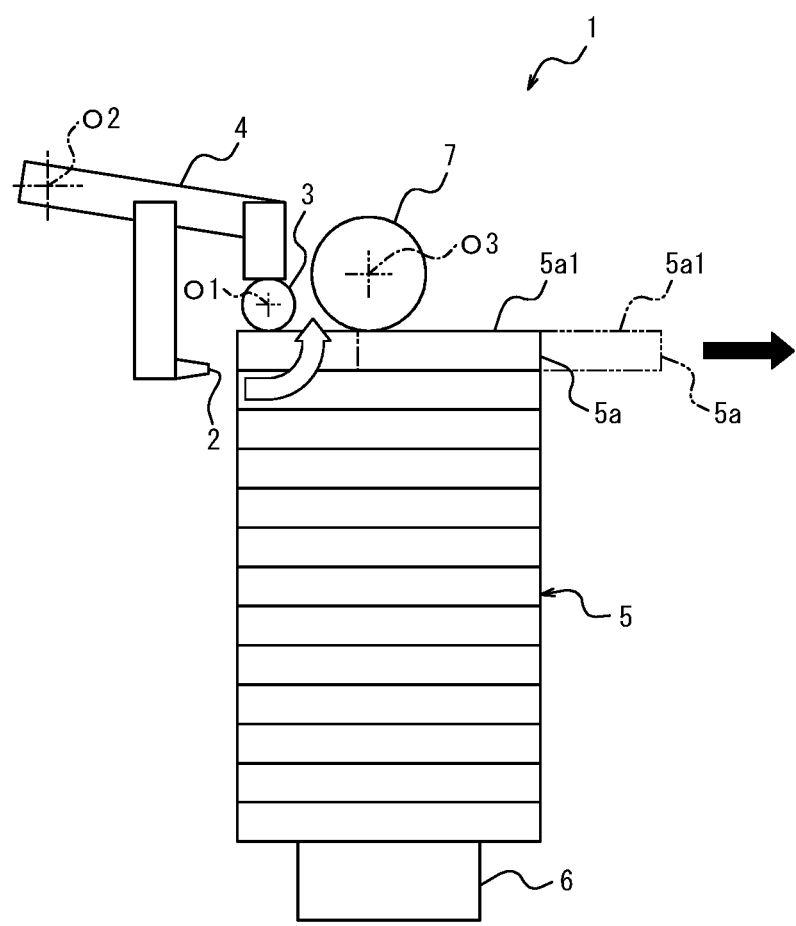
FIG. 2 is a schematic diagram illustrating the operation of the wafer separation apparatus illustrated in FIG. 1 when no sludge is caught in the wafer stack.

As illustrated in FIGS. 1 and 2, in one embodiment of the present disclosure, a wafer separation apparatus 1 has an injection port 2 that injects a fluid, a rolling element 3, and a holder 4 that movably holds the rolling element 3 in a rollable and integral manner, that is reciprocatable within a certain operation range and biased within the operation range to one side in a reciprocating direction, that is integrally connected to the injection port 2.

The wafer separation apparatus 1 also has a stacking direction feeder 6 that brings a wafer stack 5, which consists of a plurality of stacked wafers after being sliced, and the rolling element 3 close to each other in a stacking direction. The stacking direction feeder 6 is constituted of, for example, a conveyance stage that conveys the wafer stack 5 to one side in the stacking direction toward the rolling element 3.

In this embodiment, the stacking direction is a vertical direction, and the one side in the stacking direction is vertically upward. The stacking direction is not limited to the vertical direction, and may be, for example, a direction that intersects with the vertical direction.

Furthermore, the wafer separation apparatus 1 has a conveyance direction feeder 7 that conveys an outermost wafer 5a, which contacts the rolling element 3 on the one side in the stacking direction, of the wafer stack 5 in a conveyance direction that intersects (preferably orthogonally intersects) with the stacking direction after being separated. Here, the outermost wafer 5a refers to a wafer located outermost in the stacking direction of the wafers with respect to a position at which the wafer stack 5 contacts the conveyance direction feeder 7, and refers to a wafer to be separated from the wafer stack 5 when the wafer is sent to a cleaning process.

The injection port 2 is configured as a nozzle, for example. The injection port 2 is supplied with the fluid from a not-illustrated external fluid supply unit and injects the fluid. The fluid injected from the injection port 2 is not particularly limited, and is, for example, liquid such as water or a cleaning solution, gas, or the like. A biasing force that biases the holder 4 to one side in a reciprocating direction is gravity. The biasing force is not limited to gravity, but may be configured to use, for example, the elastic force of a spring, or the like.

The rolling element 3 is configured of a roller that can rotate about a first rotational axis line O1. The rolling element 3 is not limited to the roller, but may be configured of a ball, for example. However, from the viewpoint of preventing damage to the wafers due to contact with the rolling element 3, it is preferable to use the roller, which makes linear contact instead of point contact. The first rotational axis line O1 of the roller extends in a direction that intersects (preferably orthogonally intersects) with the stacking direction and intersects (preferably orthogonally intersects) with the conveyance direction.

From the viewpoint of preventing damage to the wafers due to contact with the rolling element 3, the rolling element 3 may be configured to have a contact surface, which contacts the wafers, made of an elastic material, or may be configured to have a brush on an outer surface of the roller and contact the wafers through the brush.

The holder 4 holds the injection port 2 and the rolling element 3. The holder 4 has a main body part 4a, an injection port holding part 4b that holds the injection port 2, and a rolling element holding part 4c that holds the rolling element 3. The main body part 4a is connected to a not-illustrated housing rotatably about a second rotational axis line O2, and extends from the second rotational axis line O2 to an approximate conveyance direction. The second rotational axis line O2 of the holder 4 is located vertically above the stacking direction feeder 6 and on the opposite side of the conveyance direction. The second rotational axis line O2 extends in a direction that intersects (preferably orthogonally intersects) with the stacking direction and intersects (preferably orthogonally intersects) with the conveyance direction. Here, the approximate conveyance direction is a direction whose vector component includes the direction of conveying the wafers.

The injection port holding part 4b is a member extending vertically downward from the main body part 4a that extends in the approximate conveyance direction. The rolling element holding part 4c is a member extending vertically downward from, among the main body part 4a extending in the approximate conveyance direction, a position closer to the conveyance stage than the injection port holding part 4b. The injection port 2 is held at a lower position than the rolling element 3. When the rolling element 3 contacts an end surface 5a1 of the outermost wafer 5a of the wafer stack 5, the injection port 2 is located so as to be able to inject the fluid to a boundary between the outermost wafer 5a and the other wafers.

The holder 4 is capable of reciprocating within the operation range (e.g., ±25° with respect to the horizontal) by rotational operation about the second rotational axis line O2. According to this configuration, the reciprocating operation of the holder 4 can be realized with a simple structure. However, the holder 4 is not limited to such a configuration, but may be configured to be able to reciprocate within the operation range by translational operation using, for example, a slide mechanism or the like.

The conveyance direction feeder 7 is configured of a feed roller that can rotate about a third rotational axis line O3. The feed roller is located above the conveyance stage. As the wafer stack 5 disposed on the conveyance stage is conveyed in the stacking direction, the outermost wafer 5a contacts the feed roller at the end surface 5a1. The feed roller conveys the outermost wafer 5a in the conveyance direction, while is in contact with the outermost wafer 5a, by rotating at a predetermined timing by a drive mechanism constituted of, for example, a motor, a computer, and the like. The conveyance direction feeder 7 may be constituted of a device other than the feed roller. The third rotational axis line O3 of the feed roller extends in a direction that intersects (preferably orthogonally intersects) with the stacking direction and intersects (preferably orthogonally intersects) with the conveyance direction.

From the viewpoint of preventing damage to the wafers due to contact with the feed roller, the feed roller may be configured to have a contact surface, which contacts the wafers, made of an elastic material, or may be configured to have a brush on an outer surface of the feed roller and contact the wafers through the brush.

The wafer separation apparatus 1 can carry out a wafer separation method that has an injection port movement step of moving the injection port 2 to a position corresponding to the position of the end surface 5a1 of the outermost wafer 5a by bringing the rolling element 3 into contact with the end surface 5a1 of the outermost wafer 5a on the one side of the stacking direction, a separation step of separating the outermost wafer 5a by injecting the fluid from the injection port 2 moved by the injection port movement step so that the fluid flows into between the outermost wafer 5a and the other wafers, and a conveyance step of moving the outermost wafer 5a separated by the separation step in the conveyance direction that intersects with the stacking direction.

The wafer separation method using the wafer separation apparatus 1 will be described below based on FIGS. 1 to 4.

First, in the injection port movement step, the rolling element 3 is brought into contact with a portion of the end surface 5a1 of the outermost wafer 5a on an injection port side (hereinafter, for convenience of explanation, the portion is also referred to as "injection port side portion" and a portion on the opposite side as "conveyance side portion").

As illustrated in FIG. 1, the wafer stack 5 obtained by slicing a semiconductor ingot is disposed on the conveyance stage that the stacking direction feeder 6 has. At this time, the wafer stack 5 does not catch any sludge or the like, and the end surface 5a1 of the outermost wafer 5a is assumed to horizontally extend.

The stacking direction feeder 6 conveys the wafer stack 5 to one side (here vertically upward) of the stacking direction toward the conveyance direction feeder 7. The wafer stack 5 conveyed to the one side of the stacking direction first contacts the rolling element 3. The rolling element 3 contacts the outermost wafer 5a at the end surface 5a1 of the outermost wafer 5a on the one side in the stacking direction. At this time, the holder 4 is at the lowest position in the operation range due to its own weight.

The stacking direction feeder 6 keeps conveying the wafer stack 5 to the one side in the stacking direction even after the wafer stack 5 contacts the rolling element 3. At this time, since the wafer stack 5 pushes the rolling element 3, and the holder 4 holding the rolling element 3 rotates about the second rotational axis line O2, the rolling element 3, the holder 4 holding the rolling element 3, and the injection port 2 connected to the holder 4 are integrally displaced in the stacking direction.

Since the movement of the rolling element 3 is a rotational operation centered on the second rotational axis line O2, the rolling element 3 is displaced in the conveyance direction, as well as in the stacking direction, while contacting the end surface 5a1 of the outermost wafer 5a. As the rolling element 3 rotates about the first rotational axis line O1 according to the displacement in the conveyance direction, it is possible to prevent the rolling element 3 from damaging the end surface 5a1 of the outermost wafer 5a.

As illustrated in FIG. 2, the stacking direction feeder 6 conveys the wafer stack 5 to a height (hereinafter referred to as reference height) such that the end surface 5a1 of the outermost wafer 5a contacts the feed roller. As the wafer stack 5 moves to the reference height, the injection port 2 moves further.

Here, among a boundary surface between the outermost wafer 5a and the other wafers, a portion close to the injection port 2 is referred to as a separation point. The position of the injection port 2 and an angle at which the injection port 2 injects the fluid are not particularly limited as long as the fluid injected from the injection port 2 hits the separation point. However, from the viewpoint of smoothly conveying the outermost wafer 5a in the conveyance direction, the injection port 2 is preferably set at the same height as the separation point to inject the fluid horizontally.

In the separation step, the injection port 2 injects the fluid to the separation point to separate the outermost wafer 5a from the wafer stack 5.

In the conveyance step, by a rotational operation of the feed roller that the conveyance direction feeder 7 has, the outermost wafer 5a is conveyed in the conveyance direction.

Figure 3:
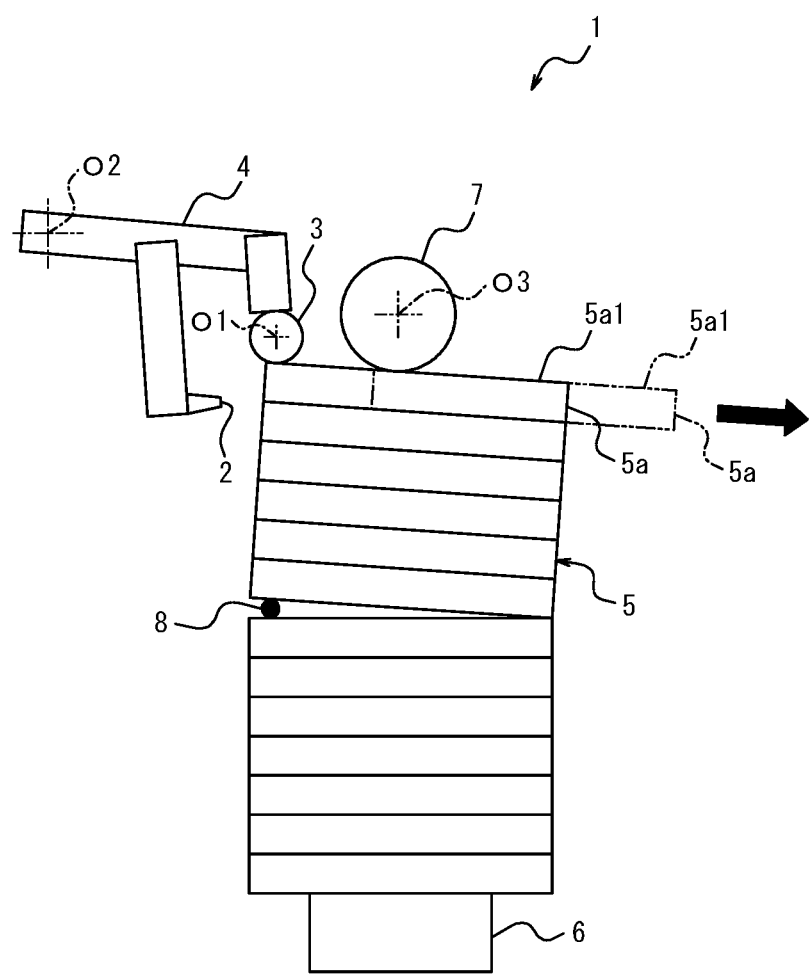
FIG. 3 is a schematic diagram illustrating the operation of the wafer separation apparatus illustrated in FIG. 1 when an outermost wafer is tilted due to sludge caught in the wafer stack.

Next, as illustrated in FIG. 3, when the outermost wafer 5a is tilted due to sludge 8 caught in the wafer stack 5 so that the separation point of the wafer stack 5 is located closer to the one side (i.e., vertically upward) in the stacking direction than the opposite portion thereof, the rolling element 3 is pushed higher, as compared to a case in which the end surface 5a1 of the outermost wafer 5a horizontally extends. As a result, as compared to the case in which the outermost wafer 5a is not tilted as illustrated in FIG. 2, the injection port 2 can be rotated together with the rolling element 3 around the second rotational axis line O2 to the one side in the stacking direction.

Therefore, when the injection port side portion of the end surface 5a1 of the outermost wafer 5a is closer to the one side in the stacking direction, i.e., when the separation point is closer to the one side in the stacking direction, the injection port 2 can be brought closer to the one side in the stacking direction in a following manner through the rolling element 3 and the holder 4. As a result, by injecting the fluid from the injection port 2 in the separation step, the fluid can flow more reliably into between the outermost wafer 5a and the other wafers.

Figure 4:
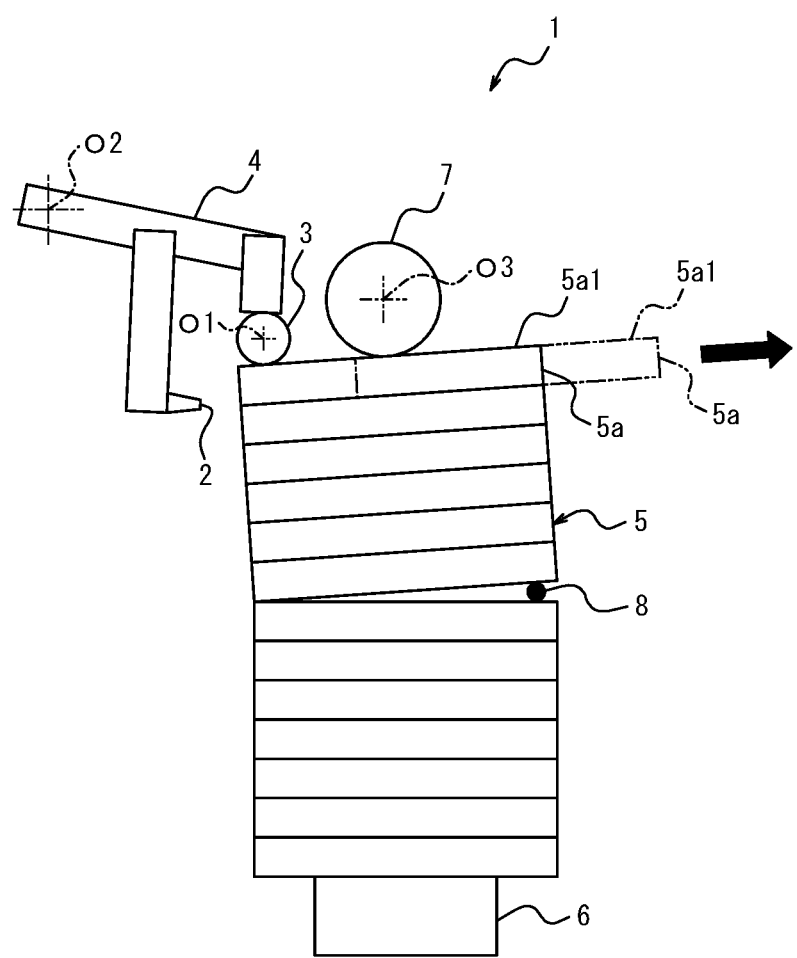
FIG. 4 is a schematic diagram illustrating the operation of the wafer separation apparatus when the outermost wafer is tilted to the opposite side of FIG. 3 due to sludge caught in the wafer stack.

Also, as illustrated in FIG. 4, for example, even when the outermost wafer 5a is tilted due to sludge 8 caught in the wafer stack 5 so that the conveyance side portion of the end surface 5a1 of the outermost wafer 5a is located closer to the one side in the stacking direction than the injection port side portion, the contact of the rolling element 3 with the injection port side portion of the end surface 5a1 of the outermost wafer 5a allows the injection port 2, together with the rolling element 3, to rotate about the second rotational axis line O2 closer to the other side (i.e., vertically downward) in the stacking direction, as compared to the case in which the outermost wafer 5a is not tilted as illustrated in FIG. 2.

Therefore, when the injection port side portion of the end surface 5a1 of the outermost wafer 5a is closer to the other side in the stacking direction, i.e., when a portion between the outermost wafer 5a and the other wafers into which the fluid injected from the injection port 2 is to flow is closer to the other side in the stacking direction, the injection port 2 can be brought closer to the other side in the stacking direction in a following manner through the rolling element 3 and the holder 4. As a result, by injecting the fluid from the injection port 2 in the separation step, the fluid can flow more reliably into between the outermost wafer 5a and the other wafers.

By changing the arrangement of the second rotational axis line O2 and the shape or structure of the holder 4, in the injection port movement step, the same operation of the injection port 2 may be achieved by bringing the rolling element 3 into contact with the conveyance side portion of the end surface 5a1 of the outermost wafer 5a. However, it is preferable to bring the rolling element 3 into contact with the injection port side portion of the end surface 5a1 of the outermost wafer 5a in the injection port movement step, as described above, in order to easily achieve stable and precise operation of the injection port 2.

In the conveyance step, the outermost wafer 5a separated in the separation step is moved by the conveyance direction feeder 7 in the conveyance direction. At that time, since the rolling element 3 is rollable with respect to the holder 4, the rolling element 3 can roll in a following manner as the end surface 5a1 of the outermost wafer 5a that moves in the conveyance direction, thus preventing damage due to contact between the end surface 5a1 of the outermost wafer 5a and the rolling element 3.

A detection unit that detects, for example, by a sensor, a conveyance failure in which the outermost wafer 5a does not move in the conveyance direction due to poor separation may be provided. In the conveyance step, when the detection unit detects a conveyance failure, the feed roller may be operated to repeatedly rotate forward and reverse. In such a case, even when the outermost wafer 5a repeatedly moves back and forth in the conveyance direction due to the repeated forward and reverse rotation of the feed roller, it is possible to prevent the occurrence of damage to the end surface 5a1 of the outermost wafer 5a owing to the following-manner operation of the rolling element 3.

Upon conveying the separated outermost wafer 5*a* by the conveyance direction feeder 7 in the conveyance direction, the wafer separation apparatus 1 then brings, by the stacking direction feeder 6, another wafer (a wafer to be next separated from the wafer stack 5) and the rolling element 3 close to each other in the stacking direction and into contact with each other, and thereafter repeats the separation and conveyance of the outermost wafer 5*a* in the same manner as described above.

The present disclosure is not limited to the above embodiment and can be variously modified without departing from the gist thereof.

Thus, the wafer separation apparatus 1 of the above embodiment can be modified as long as the wafer separation apparatus 1 has the injection port 2 that injects the fluid, the rolling element 3, and the holder 4 that movably holds the rolling element 3 in a rollable and integral manner, that is reciprocatable and biased to one side in the reciprocating direction, and that is integrally connected to the injection port 2.

The wafer separation method of the above embodiment can be modified as long as the wafer separation method, using the wafer separation apparatus 1, has the injection port movement step of moving the injection port 2 according to the position of the end surface 5*a*1 of the outermost wafer 5*a* included in the wafer stack 5 in the stacking direction, by bringing the rolling element 3 into contact with the end surface 5*a*1 of the outermost wafer 5*a*, the separation step of separating the outermost wafer 5*a* by injecting the fluid from the injection port 2 moved by the injection port movement step so that the fluid flows into between the outermost wafer 5*a* and the other wafers, and the conveyance step of moving the outermost wafer 5*a* separated by the separation step in the conveyance direction that intersects with the stacking direction.

The wafer separation method of the above embodiment can be applied to a slicing process in the manufacture of silicon wafers and used in the stage of separating and cleaning wafers after being sliced. By doing so, in the slicing process of the silicon wafers, it is possible to prevent poor wafer separation while preventing cracks and scratches on the wafers, thus improving production efficiency. The manufacture of the silicon wafers can be carried out by subjecting the silicon wafers obtained as above to processes used in normal silicon wafer manufacturing, such as chamfering, planarizing (lapping or the like), polishing, and cleaning.

The invention claimed is:

1. A wafer separation apparatus comprising:
   an injection port configured to inject a fluid;
   a rolling element; and
   a holder configured to movably hold the rolling element in a rollable and integral manner, to be reciprocatable and biased to one side in a reciprocating direction, and to be integrally connected to the injection port.

2. The wafer separation apparatus according to claim 1, wherein the holder is configured to be reciprocatable by rotational operation.

3. The wafer separation apparatus according to claim 1, wherein the rolling element is configured of a roller.

4. A wafer separation method using the wafer separation apparatus according to claim 1, the wafer separation method comprising:
   moving the injection port according to a position of an end surface of an outermost wafer included in a wafer stack in a stacking direction, by bringing the rolling element into contact with the end surface of the outermost wafer;
   separating the outermost wafer by injecting a fluid from the injection port moved by the moving of the injection port so that the fluid flows into between the outermost wafer and another wafer; and
   conveying the outermost wafer separated by the separating of the outermost wafer in a conveyance direction that intersects with the stacking direction.

5. The wafer separation method according to claim 4, wherein in the moving of the injection port, the rolling element is brought into contact with a portion of the end surface of the outermost wafer on a side of the injection port.

6. A method for manufacturing a silicon wafer, the method comprising using the wafer separation method according to claim 4,
   wherein the wafer is a silicon wafer.

* * * * *